United States Patent
Johnson et al.

(10) Patent No.: US 12,368,797 B2
(45) Date of Patent: Jul. 22, 2025

(54) TELEPHONE LINE TESTING APPARATUS WITH REMOTE CONTROL

(71) Applicant: Pine River Innovations LLC, Pine River, MN (US)

(72) Inventors: Andrew Vincent Johnson, Pine River, MN (US); Alan Lee Johnson, Pine River, MN (US); Paul Coleman Hunt, Pine River, MN (US)

(73) Assignee: Pine River Innovations, LLC, Pine River, MN (US)

( * ) Notice: Subject to any disclaimer, the term of this patent is extended or adjusted under 35 U.S.C. 154(b) by 263 days.

(21) Appl. No.: 18/066,601

(22) Filed: Dec. 15, 2022

(65) Prior Publication Data

US 2023/0208968 A1 Jun. 29, 2023

Related U.S. Application Data

(60) Provisional application No. 63/265,943, filed on Dec. 23, 2021.

(51) Int. Cl.
H04M 1/24 (2006.01)
G01R 31/58 (2020.01)
H04M 3/30 (2006.01)

(52) U.S. Cl.
CPC .............. *H04M 1/24* (2013.01); *G01R 31/58* (2020.01); *H04M 3/305* (2013.01)

(58) Field of Classification Search
None
See application file for complete search history.

(56) References Cited

U.S. PATENT DOCUMENTS

| | | | | |
|---|---|---|---|---|
| 4,912,755 A | * | 3/1990 | Blood | H04M 3/308 379/32.04 |
| 4,943,993 A | * | 7/1990 | Fore | H04M 3/30 379/27.02 |
| 5,353,327 A | * | 10/1994 | Adari | H04M 3/301 379/22 |
| 5,592,528 A | * | 1/1997 | Nelson | H02J 7/0045 455/67.11 |
| 5,619,489 A | * | 4/1997 | Chang | H04J 3/14 370/254 |
| 6,201,853 B1 | * | 3/2001 | Butler | H04M 1/24 379/22 |
| 6,618,469 B2 | * | 9/2003 | Wang | H04M 3/303 379/1.04 |
| 6,826,155 B1 | * | 11/2004 | Gershon | H04M 3/30 379/22.03 |

(Continued)

OTHER PUBLICATIONS

Admitted Prior Art; 3M 1342 Far End Device II Specs; Provided by www.AAATesters.com; Spec Sheet from website; Prior art; 2 pages; 2000; US.

(Continued)

*Primary Examiner* — Quoc D Tran
(74) *Attorney, Agent, or Firm* — Boyle Fredrickson, SC

(57) ABSTRACT

An apparatus for telephone line testing provides a tone generator that can be remotely switched to short or open via a cable pair by monitoring shorts on the cable pair itself to allow a simplified testing protocol with reduced technician travel and without the need for a remote controller carried by the technician.

14 Claims, 3 Drawing Sheets

(56) References Cited

U.S. PATENT DOCUMENTS

| | | | | |
|---|---|---|---|---|
| 6,970,534 B1* | 11/2005 | Brumble | ............... | H04M 3/308 |
| | | | | 379/19 |
| 7,010,096 B1* | 3/2006 | Wooding | ............. | H04M 3/306 |
| | | | | 379/27.02 |
| 7,620,155 B1* | 11/2009 | Barzegar | ................ | H04M 3/30 |
| | | | | 379/1.04 |
| 8,340,253 B1* | 12/2012 | Larkin | .................... | H04M 1/24 |
| | | | | 379/27.05 |
| 2003/0021388 A1* | 1/2003 | Starr | ....................... | H04M 1/24 |
| | | | | 379/1.04 |
| 2004/0221213 A1* | 11/2004 | Sawyer | ................. | H04M 3/301 |
| | | | | 714/724 |
| 2009/0262904 A1* | 10/2009 | Ponganis | ................ | H04M 1/24 |
| | | | | 379/27.01 |
| 2010/0232578 A1* | 9/2010 | Zojer | .................... | H04M 3/305 |
| | | | | 379/22 |
| 2013/0101092 A1* | 4/2013 | Wahl | ........................ | H04B 3/46 |
| | | | | 379/21 |

OTHER PUBLICATIONS

Admitted Prior Art; 3M Dynatel Far End Device III Spec Sheet; Prior art; www.3MTelecommunications.com website; 4 pages; 2009; US.

Admitted Prior Art; 3M Dynatel Far End Device III User's Guide; www.3MTelecommunications.com website; 20 pages; 2009; US.

* cited by examiner

TELEPHONE LINE TESTING APPARATUS WITH REMOTE CONTROL

CROSS REFERENCE TO RELATED APPLICATION

This application claims the benefit of U.S. Provisional Application 63/265,943 filed Dec. 23, 2021, and hereby incorporated by reference.

BACKGROUND OF THE INVENTION

The present invention relates generally to telephone line testing equipment and in particular to a testing device providing simplified remote control.

Technicians frequently perform tests on telephone cables including checking for continuity, balance, resistance, and distance measurements. In a typical test sequence, the technician starts at a distribution box providing communication with the phone network and puts a tracing tone on a cable pair intended to communicate with the customer. The technician then moves through one or more splice points (pedestals) on route to the customer, the splice points providing connections between cable pairs. Using a "sniffer" that can detect the tracing tone, the technician identifies then splices together the necessary cable pairs as needed to provide a continuous electrical connection to the customer premises.

Once the cable pairs have been connected and the sniffer confirms the tracer tone at the customer premises indicating continuity, the technician goes back to the distribution box and disconnects the tracer tone. The technician shorts the cable pair to ground and travels back toward the customer premises successively testing the cable resistance at each pedestal using a resistive balance test (testing the resistance of each cable to ground to see that they are equal and do not exceed the allowable resistance). The technician then travels once again to the distribution box and opens the cable pairs and making yet another trip between the distribution box and the customer premises, at each pedestal testing the cable pairs to establish the distance of each segment of the cable using a time domain reflectometry meter.

SUMMARY OF THE INVENTION

The present invention greatly reduces the number of trips required by the technician between the customer premises and the distribution box by providing a tone generator that can be attached to one or more cable pairs and switched to open and short those cable pairs remotely. The remote control is implemented by a simple shorting together of the cable pair, at the far end of the cable pair being tested, limiting the need to travel back to the test device or for the technician to carry a special remote controller. In that latter respect, the shorting used for remote control can be accomplished simply by the technician manually touching the cable pairs together.

More specifically, the invention provides a device for testing telephone lines having a first and second connector terminal for connecting to respective conductors of a telephone line pair. A current sensor senses current flow between the first and second connector terminals, and an electrical switch system communicates with the first and second connector terminals to electrically short the first and second connector terminals in a first state and to remove the electrical short between the first and second terminals in a second state. A control circuit communicates with the current sensor and the electrical switch system to move the electrical switch system from the second state to the first state upon detecting a shorting of the first and second connector terminals for a predetermined time.

It is thus a feature of at least one embodiment of the invention to provide for a test device that can be operated remotely simply by applying a short circuit from the remote location to the conductors under test.

The predetermined time may be within a range having a predetermined upper value and predetermined lower value.

It is thus a feature of at least one embodiment of the invention to alternatively permit different lengths of times to signal different testing regimes and to distinguish between legitimate remote signals and incidental shorting.

The predetermined time may be greater than one second.

It is thus a feature of at least one embodiment of the invention to provide shorting times that can be easily implemented by hand with the technician touching the wires together.

The shorting may provide a current flow equivalent to a resistance across the first and second terminals of less than 1000 ohms.

It is thus a feature of at least one embodiment of the invention to accommodate finite resistance of the lines such as would limit absolute current flow during a short situation.

The control circuit may include a timer moving the electrical switch system from the first state to the second state after a predetermined time.

It is thus a feature of at least one embodiment of the invention to restore remote control via controlled shorting after the device has shorted a conductor pair for testing.

The device may further include a tone generator communicating with the electrical switch system, and the electrical switch system may communicate with the first and second connector terminals to electrically open the first and second connector terminals in a third state and to connect the tone generator to the first and second connector terminals in a fourth state. In this case, the control circuit communicates with the current sensor and the electrical switch system to move the electrical switch system from the fourth state to the third state upon detecting a short for a second predetermined time different from the first predetermined time when a shorting is not detected.

It is thus a feature of at least one embodiment of the invention to incorporate a tone generator into the device to assist in continuity detection and a wholly separate tone generator from the wire pair during an open circuit test to reduce test interference while allowing a lower impedance tone generator for greater distance.

The device may include an electrical connector communicating between the connector terminals and corresponding alligator clips via pigtail conductors.

It is thus a feature of at least one embodiment of the invention to provide a versatile field device that can be used with a variety of splice blocks.

The device may further include a sensing circuit detecting attachment of the pigtail conductors to the electrical connector and to provide power to the device from internal batteries of the device upon the attachment.

It is thus a feature of at least one embodiment of the invention to automatically turn power off when the device is put away to preserve battery life.

The control circuit may further monitor voltage of a contained battery to modify the tone generators to indicate a low battery condition.

It is thus a feature of at least one embodiment of the invention to allow the remote technician to be aware of low battery power during testing and away from direct operation of the device.

These particular objects and advantages may apply to only some embodiments falling within the claims and thus do not define the scope of the invention.

DETAILED DESCRIPTION OF THE PREFERRED EMBODIMENT

Figure 1:
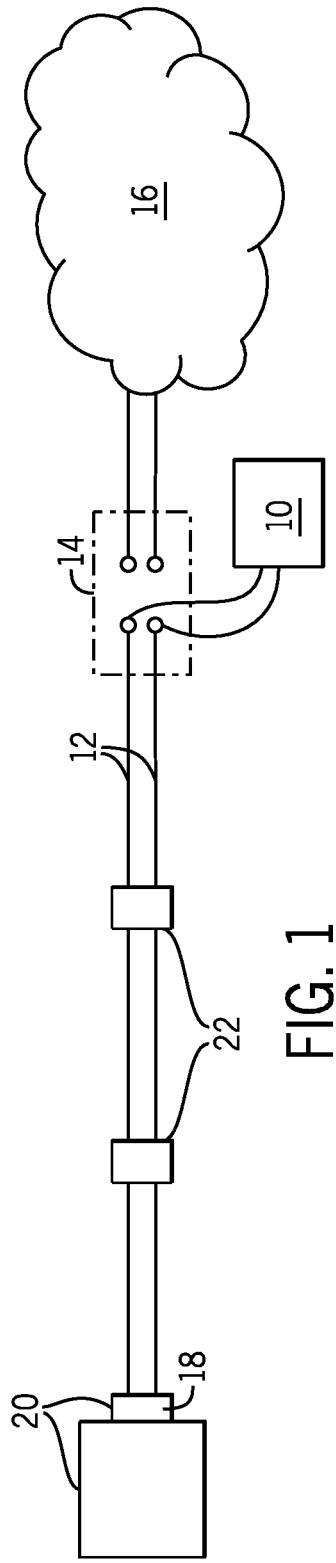
FIG. 1 is a simplified diagram of a DSL (digital subscriber line) cable between a splice block communicating with the DSA (directory service agent) of a phone provider, then through a set of pedestals having splice points, and finally to an NID (network interface device) at a house or business.

Referring now to FIG. 1, the present invention provides a test device 10 that may be attached to one or more telephone line pairs 12 that will be used to communicate electrical signals from a splice block 14 of the DSA 16 of the phone provider to an NID 18 on a home or business 20. Each line pair 12 will have two conductors and the line pairs 12 will typically pass through one or more pedestals 22 providing splice points in a metal enclosure on the way from the DSA 16 to the NID 18. The following description will be with respect to a test device 10 for operating on two line pairs; however, it will be understood from the following description that a device for a single-line pair or more than two line pairs may be readily constructed.

During use, the test device 10 is attached to two line pairs 12 at the DSA 16 when the line pairs 12 are disconnected from the splice block 14, this disconnection serving to prevent interference with the DSA. Two different tones, one for each line pair 12, are generated by the test device 10 and communicated to the respective line pair. The technician then leaves the DSA 16 and the test device 10 and moves successively along the pedestals 22 toward the home or business 20, at each pedestal 22 identifying each upstream cable pair 12 with a sniffer that can detect the transmitted tones and make the necessary splices to downstream cable pairs 12. At the NID 18, the technician uses the sniffer to establish electrical continuity from the splice block 14 to the NID 18.

Without moving from the NID 18, the technician may short together the conductors of each line pair 12 to cause the test device 10 to either short the conductors of that line pair together or to open the conductors of that line pair 12 and disconnect the tone generator so that additional tests of balance, resistance, and distance measurements may be made. The technician then may retrace the path from the home or business 20 to the splice block 14 stopping at each pedestal to perform the same tests of balance, resistance, and distance measurements while cycling the test device 10 between open and short conditions, again by shorting together the conductors of the line pairs as will be discussed below. Finally, the line pairs 12 are connected at the splice block 14 to the DSA 16. By using the test device 10, the number of trips by the technician between the splice block 14 and the home or business 20, the latter of which may be separated by many miles, is substantially reduced.

Figure 2:
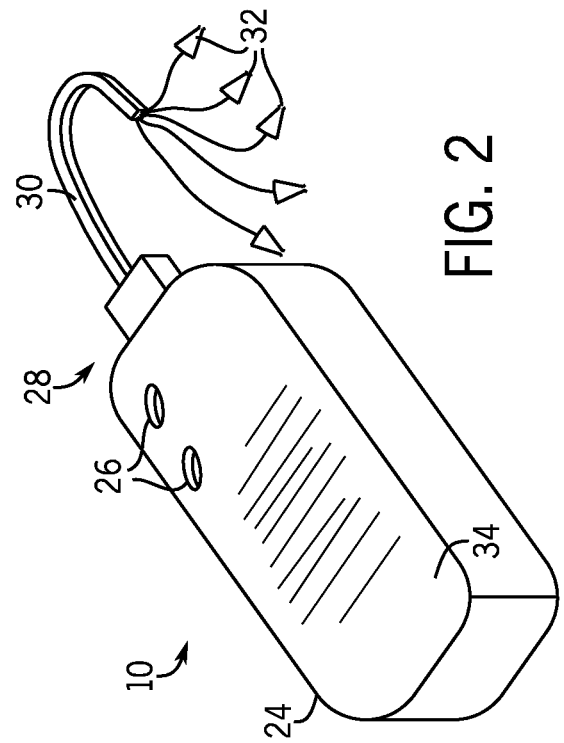
FIG. 2 is a perspective view of the test device of the present invention showing a removable pigtail connector having clips for attachment to the cable.

Referring now to FIG. 2, the test device 10 may provide a housing 24, for example, constructed of electrically insulating thermoplastic and sealed to provide a weather resistant enclosure for the below described electronics. A front panel of the housing 24 may expose a red and green LED 26, to be described further below, and which provide an indication of operating state. One end of the housing 24 provides a two-part electrical connector 28, one part attached to the housing 24 and the other part leading to a pigtail assembly 30 providing for a set of five alligator clips 32. These five alligator clips 32 allow separate electrical connection to the conductors of two line pairs 12 and a ground in the cable run. The front panel may also provide instructions 34 for use.

Figure 3:
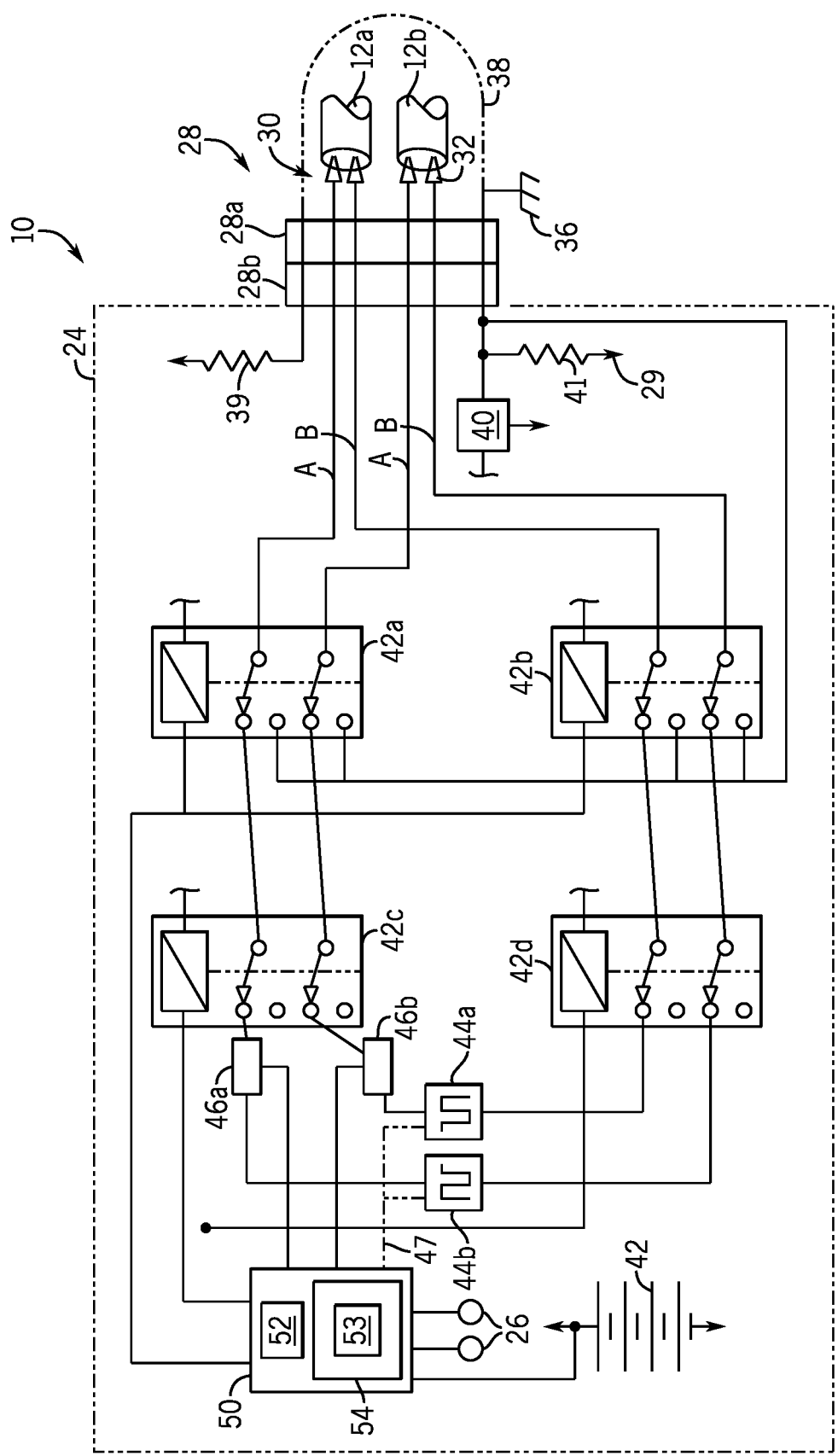
FIG. 3 is a simplified schematic of the circuitry of the test device of FIG. 2 including a programmable controller.

Referring now to FIG. 3, a first connector half 28a of the connector 28 attached to the pigtail assembly 30 may provide for six conductors communicating, respectively, through the alligator clips 32 with conductors A and B of line pair 12a, conductors A and B of line pair 12b, and a ground reference 36 (typically earth ground). A remaining conductor communicates via a jumper 38 also with ground reference 36.

A second connector half 28b attached to the housing 24 carries the signals from the conductors A and B of each of the line pairs 12a and 12b and the ground reference 36 to internal circuitry of the housing 24 as will be discussed. The remaining conductor communicates through current-limiting resistor 39 to a positive battery voltage provided by internal battery 43 referenced to an internal ground point 29.

When the connector halves 28a and 28b are connected to each other, current flowing through the jumper 38 is detected by a power control circuit 40 which activates power to the remaining circuitry of the test device 10, essentially allowing the connector halves 28 to operate as a power switch. The circuit ground 29 is isolated from the earth ground reference 36 by a resistor 41 which together with resistor 39 helps reduce measurement errors from induced voltages between the earth ground reference 36 and the line pairs 12.

Referring still to FIG. 3, the device 10 internally provides for a set of four, double-pole, double-throw relays 42a-42d. Relays 42a and 42b, as will be described, operate to short the conductors A and B of line pairs 12a and 12b to ground, while relays 42c and 42d operate to open the conductors A and B of line pairs 12a and 12b.

More specifically, one conductor of each of the line pairs 12a and 12b goes to a respective pole of relay 42a and the other conductor of each of the line pairs 12a and 12b connects to a respective pole of relay 42b. The normally-closed throws of each of these relays 42a and 42b connect each to a respective pole of a respective relay 42c and 42d while the normally-open throw of each of the relays 42a and 42b is connected to ground reference 36.

The normally-closed throws of relays 42c and 42d are connected respectively to oscillators 44a or 44b, with the connection to the relay 42c passing through current sensors 46a and 46. The oscillators 44 are square wave oscillators providing a differential output with the oscillator signals going to relay 42c being the logical inverse of the oscillator signals going to the relay 42d to provide differential signaling over the line pairs 12a and 12b. It will be appreciated that the oscillators 44 may provide for arbitrary wave shapes beyond simple square waves as discussed herein.

Each of the relays 42 receives power from the power control circuit 40 only when the connectors 28 are joined, and after so powered, the coils of the relays 42 may be activated by a controller 50, for example, a microcontroller, having a processor 52 executing a stored program 53 held in computer memory 54. The controller 50 may also communicate with the LEDs 26 and may connect an internal analog-to-digital converter to the positive terminal of the battery 45 to measure battery voltage. As will be generally understood in the art all of the signal lines to the controller 50 from the line pairs 12 may be protected against overvoltage, for example, by well understood protection circuits using capacitive filters, diodes, transit suppression devices, optical isolators or the like.

Figure 4:
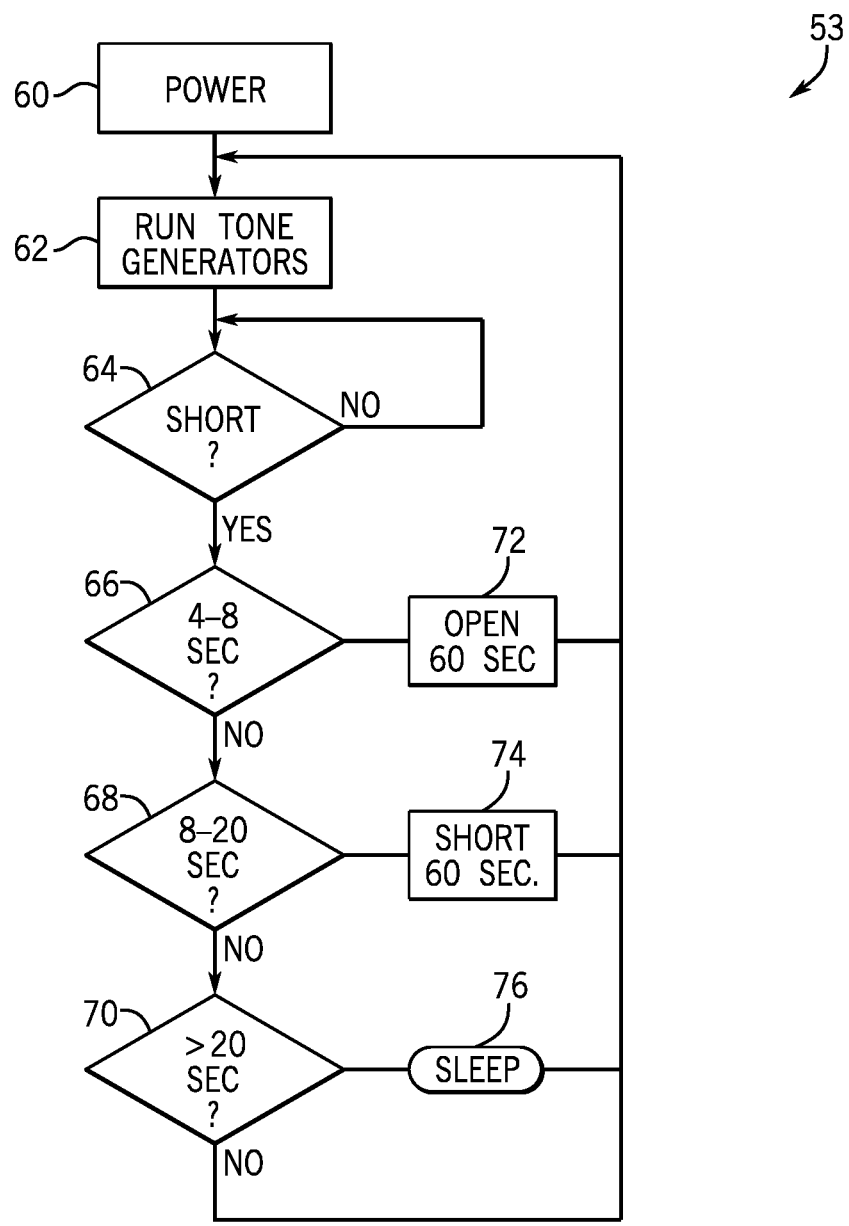
FIG. 4 is a flow chart of the program executed by the controller of FIG. 3.

Referring now also to FIG. 4, when the connector halves 28 are joined, the power control circuit 40 provides power to the relays 42 and the controller 50 from the battery 45 as indicated by process block 60. At this time the green LED will blink, for example, once every two seconds to indicate that the batteries are good, or if the batteries are weak, will flash read every two seconds to indicate that the batteries are low, as determined by a measurement of the voltage of the battery 45 underload by the controller 50. In one embodiment, battery 45 may comprise four series-connected AA cells to provide six volts of operating power, and a low voltage may be indicated if less than 3.6 volts are present under load.

While the oscillators 44 are indicated as separate from the controller 50, it will be appreciated that the oscillators 44 may be implemented directly by the controller 50, for example, using interrupt timers driving a differential line driver. More generally, the oscillators 44 may be controlled by the controller 50 in frequency, pattern, and on and off state as indicated by dotted line 47.

Referring now to process block 62 of FIG. 4, after power has been applied to the circuitry by the power control circuit 40 at process block 60, the oscillators 44 are activated by the controller 50, and with the relays 42 in their inactivated state, the oscillator signals are communicated to the line pairs 12a and 12b. Generally, the oscillators will have perceptibly different characteristics to allow the different line pairs 12a and 12b to be distinguished, for example, oscillator 44a producing 1000 Hz tone repeating at 3 Hz with the duration of approximately 150 ms and oscillator 44b producing 1000 Hz tone with two successive beeps occurring at 3 Hz produced by a 50 ms on-time followed by 50 ms off-time followed by a 50 ms on-time. The oscillators 44 generally provide square wave outputs and may be controlled by the processor 52 to provide outputs at 500 Hz when the battery is low to provide audible feedback of a low battery condition.

During the time when the oscillators 44a and 44b are in a high state with respect to their connection to relay 42c, the controller 50 monitors the current sensors 46a and 46b to detect current in excess of about 1.3 mA corresponding to a short of 500 ohms across the conductors of a line pair 12 indicating a short condition per decision block 64.

If a short is detected at decision block 64, then at succeeding decision blocks 66, 68, and 70 the uninterrupted duration of the short is measured to determine whether it is in a first range of 4-8 seconds, a second range of 8-20 seconds, or third range of greater than 20 seconds. This measurement is subject to a low-pass filter having a time constant of about 0.1 second. Implicitly, shorts for less than four seconds are ignored.

If the determined interval of the short is in the first range, per decision block 66, then as indicated by process block 72, relays 42c and 42d are activated to open the conductors of the line pairs 12a and 12b removing them from the oscillators 44a and 44b for 60 seconds to allow the necessary open state tests to be conducted.

Likewise if the determined interval of the short is in the second range, per decision block 68, as indicated by process block 74, the relays 42a and 42b are activated, shorting the conductors of the line pairs 12a and 12b to ground reference 36.

If the determined interval of the short is in the third range, per decision block 70, as indicated by process block 76, the circuitry of the test device 10 is placed in a sleep state. In the sleep state, the relays 42 are deactivated and the controller 50 is placed in a sleep mode which may, for example, lower the clock frequency and deactivate portions of the processor to be awakened periodically by a low-power timer. During these awakened periods of the sleep state, if the short is removed, the circuitry wakes up again. A sleep state may also be entered if a short has not been detected for an extended time, for example, 2 hours and typically more than 30 minutes, indicating that the device is not currently in use.

As an alternative to measuring a duration of a continuous tone, a unique pattern of shorts of at least a predetermined duration (for example, greater than one second) may be used, for example, with two successive shorts of one second separated by less than two seconds providing for a first state change signal detected at decision block 66 and three successive shorts of one second separated by less than two seconds providing for a second state change signal detected at decision block 68, or the like. In all cases, the shorting process is intended to be implemented by a human without requiring the assistance of a supplemental electronic device.

In some embodiments, prior to activation of the relays in process blocks 72 and 74, a unique tone sequence may be generated to confirm this state change process of those process blocks through control of the oscillators 44 by the controller 50 to the remote technician.

If a short is detected for more than 14 seconds, in some embodiments, both of the wire pairs get short beeps once per second to inform the technician of a persistent short.

It will be appreciated from the above description that although the test device 10 can be controlled remotely simply by a manual shorting together of lines of the cable pair to which the test device 10 is connected, this shorting process may alternatively be implemented by a specialized controller automatically performing a shorting of the line pair by a predetermined duration, for example, upon pressing of a labeled button on the specialized controller. For example, a first button, when pressed, may implement a timer to close a relay shorting the line pair together for six seconds and a second button, when pressed, may control a timer for activating the same relay to short the line pair together for nine seconds implementing the control described above. Such a device would include alligator clips and a pigtail assembly as discussed above for connection to the line pair and may be incorporated into a test meter and/or sniffer for performing the open and short tests described above as an integrated device.

While the present invention has been described with respect to a controller, it will be appreciated by those of ordinary skill in the art that alternative circuit implementations may be substituted for the controller including, for example, dedicated integrated circuits, discrete circuitry, field programmable gate arrays, and the like.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom", and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including", and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What we claim is:

1. A device for testing telephone lines comprising:
   a first and second connector terminal for connecting to respective conductors of a telephone line pair;
   a current sensor sensing current flow between the first and second connector terminals;
   an electrical switch system communicating with the first and second connector terminals to electrically short the first and second connector terminals in a first state and to remove the electrical short between the first and second terminals in a second state; and
   a control circuit communicating with the current sensor and the electrical switch system to move the electrical switch system from the second state to the first state upon detecting a shorting of the first and second connector terminals for a predetermined time;
   further including a tone generator communicating with the electrical switch system and wherein the electrical switch system communicates with the first and second connector terminals to electrically open the first and second connector terminals in a third state and to connect the tone generator to the first and second connector terminals in a fourth state; and
   wherein the control circuit communicates with the current sensor and the electrical switch system to move the electrical switch system from the fourth state to the third state upon detecting a short for a second predetermined time different from the first predetermined time when a shorting is not detected.

2. The device of claim 1 wherein the second predetermined time is within a range having a predetermined upper value and predetermined lower value.

3. The device of claim 1 wherein the predetermined time is greater than one second.

4. The device of claim 1 wherein the shorting provides a current flow equivalent to a resistance across the first and second terminal of less than 1000 ohms.

5. The device of claim 1 wherein the control circuit includes a timer moving the electrical switch system from the third state to the fourth state after a predetermined time when a shorting is not detected.

6. The device of claim 1 further including:
   a third and fourth connector terminal for connecting to respective conductors of a second telephone line pair; and
   a second current sensor sensing current flow between the third and fourth connector terminals;
   wherein the electrical switch system further communicates with the third and fourth connector terminals to electrically short the third and fourth connector terminals in a fifth state and to remove the electrical short between the third and for terminals in a sixth state; and
   wherein the control circuit communicates with the second current sensor and the electrical switch system to move the electrical switch system from the sixth state to the fifth state upon detecting a shorting of the third and fourth connector terminals for a predetermined time.

7. The device of claim 6 further including a second tone generator communicating with the electrical switch system and producing a tone perceptively distinguishable from a tone of the tone generator and where the electrical switch system communicates with the first, second, third, and fourth connector terminals to:
   (a) electrically open the first and second connector terminals in a third state and to connect the tone generator to the first and second connector terminals in a fourth state; and wherein the control circuit communicates with the current sensor and the electrical switch system to move the electrical switch system from the third state to the fourth state upon detecting a shorting of the first and second connector terminals for a second predetermined time; and
   (b) electrically open the third and fourth connector terminals in a seventh state and to connect the second tone generator to the third and fourth connector terminals in an eighth state; and wherein the control circuit communicates with the second current sensor and the electrical switch system to move the electrical switch system from the seventh state to the eighth state upon detecting a predetermined current threshold for a second predetermined time.

8. The device of claim 7 further including an electrical connector communicating between the first, second, third, and fourth connector terminals and communicating with corresponding alligator clips via pigtail conductors.

9. The device of claim 8 further including a sensing circuit detecting attachment of the pigtail conductors to the electrical connector and to provide power to the device from internal batteries of the device upon the attachment.

10. The device of claim 8 wherein the control circuit further monitors voltage of a contained battery to modify the tone generators to indicate a low-battery condition.

11. The device of claim 1 wherein the predetermined time is within a range having a predetermined upper value and predetermined lower value.

12. The device of claim 1 wherein the predetermined time is greater than one second.

13. The device of claim 1 wherein the shorting provides a current flow equivalent to a resistance across the first and second terminal of less than 1000 ohms.

14. The device of claim 1 wherein the control circuit includes a timer moving the electrical switch system from the first state to the second state after a predetermined time.

\* \* \* \* \*